US012568866B2

(12) United States Patent    (10) Patent No.:    US 12,568,866 B2
Tsao et al.    (45) Date of Patent:    Mar. 3, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Pei-Haw Tsao, Tai-Chung (TW); An-Tai Xu, Cupertino, CA (US); Huang-Ting Hsiao, Taoyuan County (TW); Kuo-Chin Chang, Chiayi (TW)

(73) Assignee: TAIWAN SEMICONDUCTOR MANUFACTURING COMPANY LTD., Hsinchu (TW)

( * ) Notice:    Subject to any disclaimer, the term of this patent is extended or adjusted under 35 U.S.C. 154(b) by 708 days.

(21) Appl. No.: 17/818,421

(22) Filed:    Aug. 9, 2022

(65)    Prior Publication Data

US 2022/0384377 A1    Dec. 1, 2022

Related U.S. Application Data

(60) Continuation of application No. 16/205,705, filed on Nov. 30, 2018, now Pat. No. 11,495,556, which is a
(Continued)

(51) Int. Cl.
H01L 23/00    (2006.01)
H01L 23/14    (2006.01)
(Continued)

(52) U.S. Cl.
CPC ............ H01L 24/03 (2013.01); H01L 23/145 (2013.01); H01L 23/49811 (2013.01);
(Continued)

(58) Field of Classification Search
CPC .......................... H01L 2224/113–1148; H01L 2224/13016–13019;
(Continued)

(56)    References Cited

U.S. PATENT DOCUMENTS

2013/0284509 A1*  10/2013  Murayama ........... H05K 3/3436
                                                        174/267
2014/0339710 A1*  11/2014  Fujiwara ................. H01L 25/50
                                                        438/119
2015/0262954 A1*   9/2015  Lee ......................... H01L 24/13
                                                        257/737

* cited by examiner

*Primary Examiner* — Brigitte A Paterson
(74) *Attorney, Agent, or Firm* — WPAT LAW; Anthony King

(57)    ABSTRACT

A semiconductor structure includes a semiconductor chip, a substrate and a plurality of bump segments. The bump segments include a first group of bump segments and a second group of bump segments collectively extended from an active surface of the semiconductor chip toward the substrate. Each bump segment of the second group of bump segments has a cross-sectional area greater than a cross-sectional area of each bump segment of the first group of bump segments. The first group of bump segments includes a first bump segment and a second bump segment. Each of the first bump segment and the second bump segment includes a tapered side surface exposed to an environment outside the bump segments. A portion of a bottom surface of the second bump segment is stacked on the first bump segment, and another portion of the bottom surface of the second bump segment is exposed to the environment.

20 Claims, 14 Drawing Sheets

Related U.S. Application Data division of application No. 14/554,788, filed on Nov. 26, 2014, now Pat. No. 11,018,099.

(51) Int. Cl.
| | |
|---|---|
| *H01L 23/31* | (2006.01) |
| *H01L 23/498* | (2006.01) |
| *H01L 23/532* | (2006.01) |

(52) U.S. Cl.
CPC .. *H01L 23/49822* (2013.01); *H01L 23/49827* (2013.01); *H01L 24/05* (2013.01); *H01L 24/11* (2013.01); *H01L 24/13* (2013.01); *H01L 24/16* (2013.01); *H01L 24/81* (2013.01); *H01L 23/3114* (2013.01); *H01L 23/49816* (2013.01); *H01L 23/5329* (2013.01); *H01L 23/562* (2013.01); *H01L 2224/0221* (2013.01); *H01L 2224/02215* (2013.01); *H01L 2224/02372* (2013.01); *H01L 2224/02381* (2013.01); *H01L 2224/0345* (2013.01); *H01L 2224/0346* (2013.01); *H01L 2224/0362* (2013.01); *H01L 2224/0382* (2013.01); *H01L 2224/0401* (2013.01); *H01L 2224/05008* (2013.01); *H01L 2224/05022* (2013.01); *H01L 2224/05024* (2013.01); *H01L 2224/05073* (2013.01); *H01L 2224/05566* (2013.01); *H01L 2224/05568* (2013.01); *H01L 2224/05573* (2013.01); *H01L 2224/1145* (2013.01); *H01L 2224/1146* (2013.01); *H01L 2224/1147* (2013.01); *H01L 2224/11903* (2013.01); *H01L 2224/13007* (2013.01); *H01L 2224/13017* (2013.01); *H01L 2224/13018* (2013.01); *H01L 2224/13023* (2013.01); *H01L 2224/1308* (2013.01); *H01L 2224/13082* (2013.01); *H01L 2224/13083* (2013.01); *H01L 2224/13084* (2013.01); *H01L 2224/13109* (2013.01); *H01L 2224/13111* (2013.01); *H01L 2224/13113* (2013.01); *H01L 2224/13118* (2013.01); *H01L 2224/1312* (2013.01); *H01L 2224/13123* (2013.01); *H01L 2224/13139* (2013.01); *H01L 2224/13144* (2013.01); *H01L 2224/13147* (2013.01); *H01L 2224/13609* (2013.01); *H01L 2224/13611* (2013.01); *H01L 2224/13616* (2013.01); *H01L 2224/13639* (2013.01); *H01L 2224/13644* (2013.01); *H01L 2224/13655* (2013.01); *H01L 2224/13664* (2013.01); *H01L 2224/16057* (2013.01); *H01L 2224/16059* (2013.01); *H01L 2224/16113* (2013.01); *H01L 2224/16225* (2013.01); *H01L 2224/16227* (2013.01); *H01L 2224/16238* (2013.01); *H01L 2224/81191* (2013.01); *H01L 2924/15311* (2013.01); *H01L 2924/3511* (2013.01); *H01L 2924/3512* (2013.01); *H01L 2924/35121* (2013.01)

(58) Field of Classification Search
CPC ........................ H01L 2224/1355–13553; H01L 2224/1405–14051; H01L 2224/16057–1607; H01L 2224/14057; H01L 2224/1701
See application file for complete search history.

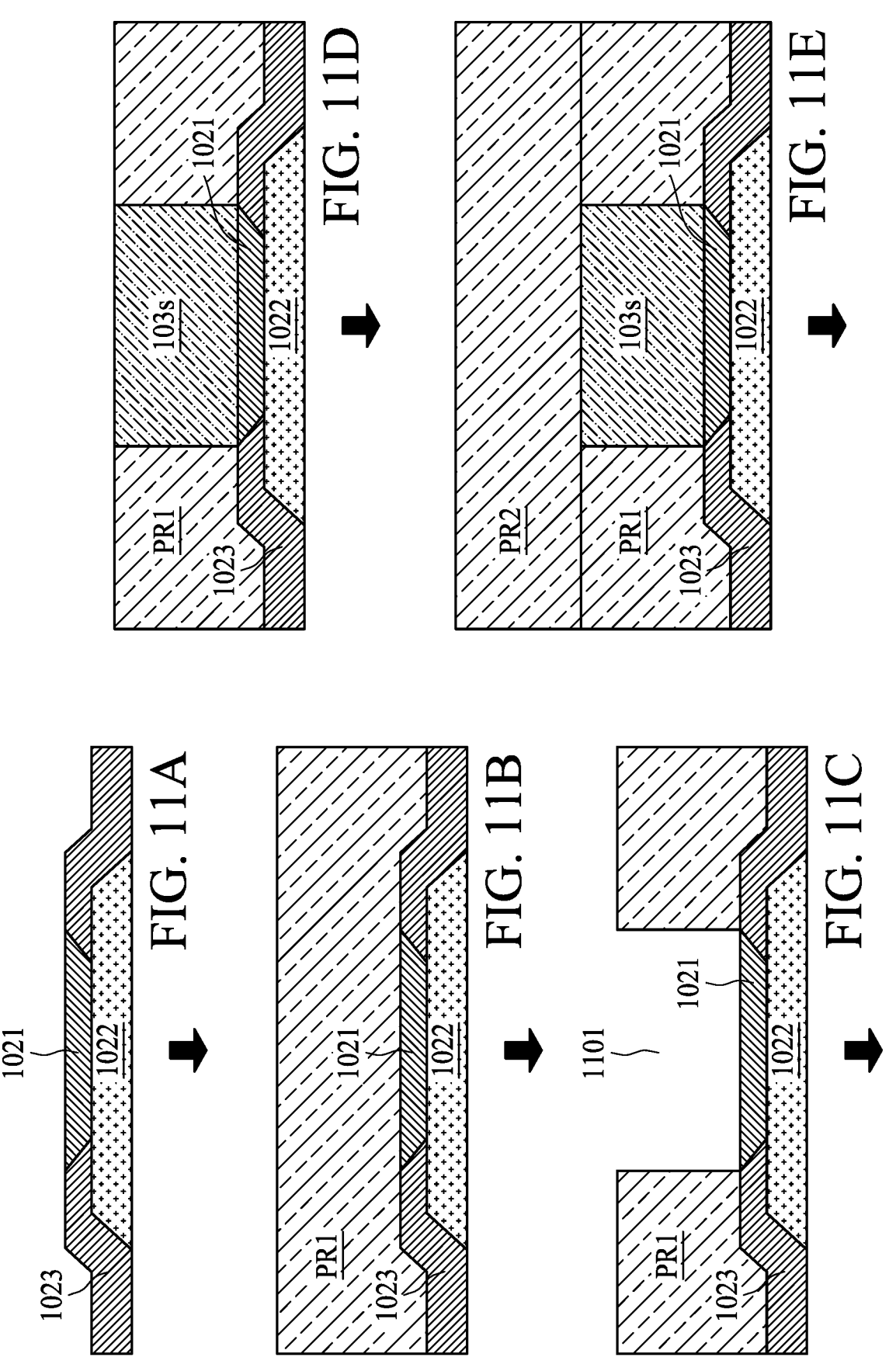

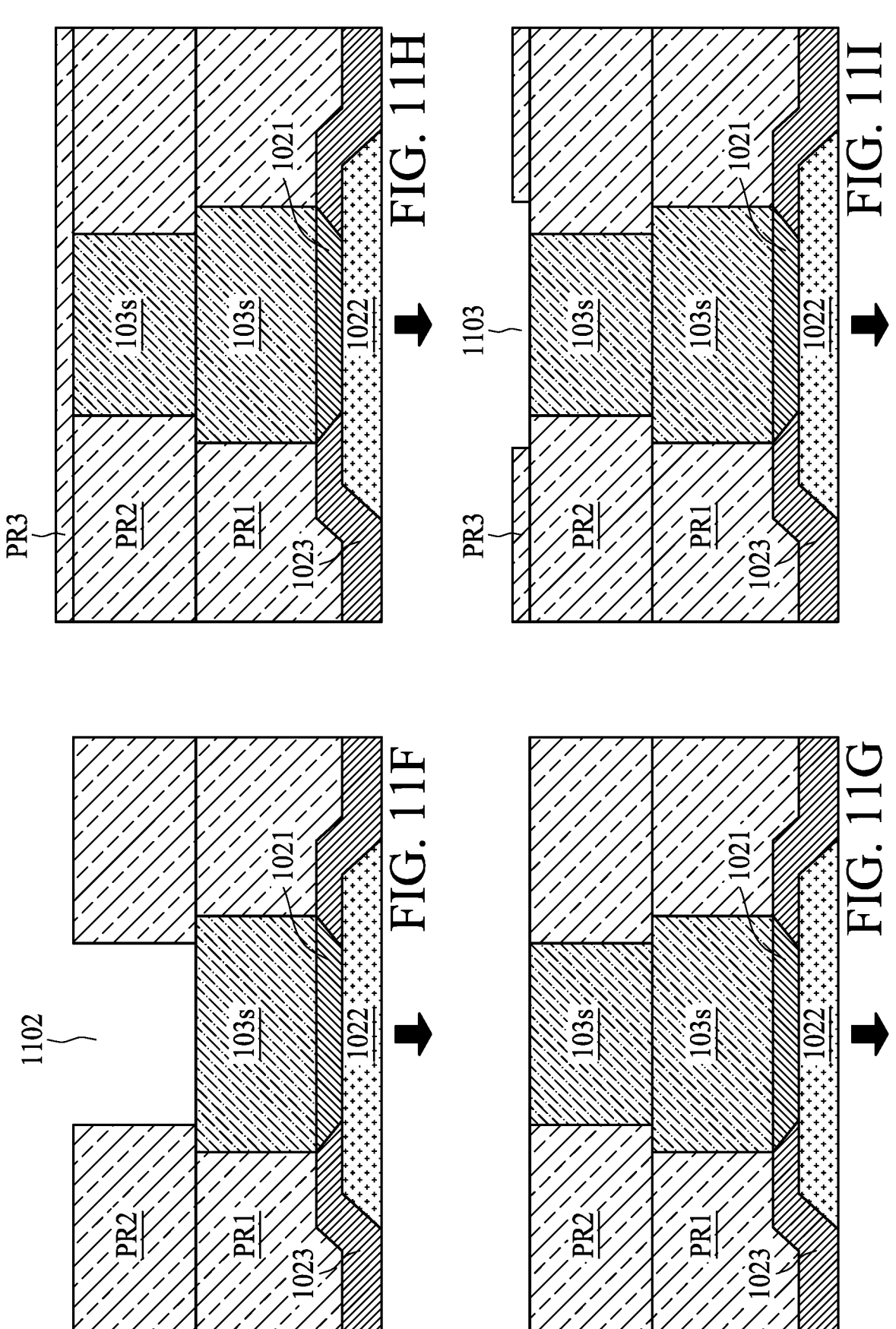

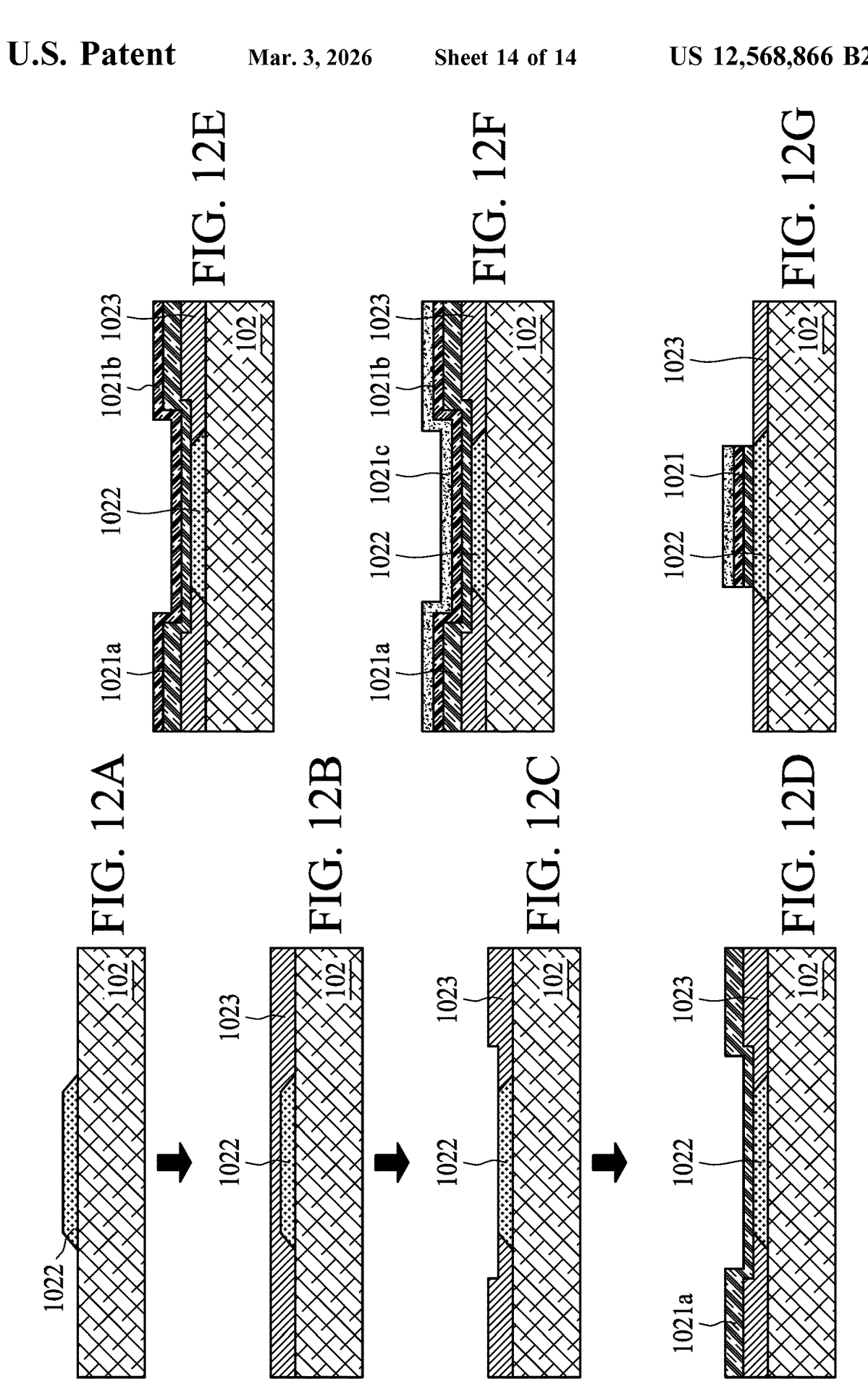

SEMICONDUCTOR STRUCTURE AND METHOD OF MANUFACTURING THE SAME

PRIORITY CLAIM AND CROSS-REFERENCE

The present application is a continuation application of U.S. patent application Ser. No. 16/205,705 filed on Nov. 30, 2018, which is a divisional application of U.S. patent application Ser. No. 14/554,788 filed on Nov. 26, 2014, each of which is incorporated herein by reference in its entirety.

BACKGROUND

The present disclosure relates generally to a semiconductor structure.

Since the invention of integrated circuits, the semiconductor industry has experienced continuous rapid growth due to constant improvements in the integration density of various electronic components (i.e., transistors, diodes, resistors, capacitors, etc.) and IC semiconductor packages. For the most part, these improvements in integration density have come from repeated reductions in minimum feature size, allowing more components to be integrated into a semiconductor chip or package.

One approach for allowing more components to be integrated into a semiconductor package is the adoption of flip chip structures, in which a semiconductor chip is bonded to a substrate with conductive bumps and also the semiconductor chip is "flipped" onto the active circuit surface. Such flip chip package has a problem that it is subject to different temperatures during the packaging process. As a result, the package is highly stressed due to the different coefficients of thermal expansion (CTE) of the various package substrate and chip materials, which in turn may cause the substrate to bow, warp or crack. The stress may result in crack/delamination in the dielectric layers of the semiconductor chips and leads to IC product failure (especially for semiconductor chips/wafers with extreme low dielectric material layer). A conventional approach to reduce the stress is to increase the size and the number of conductive bumps. However, this approach is impractical due to bump pitch limitation and constraint in IC metal trace routing area. Accordingly, what are needed are package structures that can absorb the structures' internal stresses so as to prevent crack/delamination in the dielectric layers of the semiconductor chips and to enhance the reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-11K schematically illustrate a method of forming a conductive bump over a semiconductor chip in accordance with one embodiment of the present disclosure.

FIGS. 12A-12G schematically illustrate a method for forming an under bump metallurgy (UBM) structure in accordance with one embodiment of the present disclosure.

DETAILED DESCRIPTION

Figure 1:
FIG. 1 is a cross-sectional view illustrating a semiconductor structure in accordance with one embodiment of the present disclosure.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing operations and/or features of a device may be only briefly described. Also, additional processing operations and/or features can be added, and certain of the following processing operations and/or features can be removed or changed while still implementing the claims. Thus, the following description should be understood to represent examples only, and are not intended to suggest that one or more operations or features is required.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In reference to the drawings, FIG. 1 is a cross-sectional view illustrating a semiconductor structure 100 in accordance with one embodiment of the present disclosure. As shown in FIG. 1, the semiconductor structure 100 is arranged in flip chip configuration (as known as controlled collapse chip connection or C4). Compared with packaging techniques such as wire bonding and tape-automated bonding (TAB), a flip-chip package has shorter signal transmission path between the semiconductor chip and the substrate and thus it has better electrical properties. In addition, a flip-chip package may be designed to expose the back surface of the semiconductor chip (one of the mains surface not facing the substrate) so as to increase heat dissipation rate.

According to FIG. 1, the semiconductor structure 100 comprises a semiconductor chip 102 and a substrate 101. The semiconductor chip 102 may be bonded directly to the substrate 101 with a conductive bumps 103 (having a metal cap layer 105) and a conductor 104 (e.g., solder). During packaging, the semiconductor chip 102 is "flipped" onto the active surface 106 of the semiconductor chip 102 so that the conductive bumps 103 form electrical and mechanical connections between the semiconductor chip 102 and the substrate 101. Underfill material (not shown) applied between the gaps formed by the conductive bumps 103 serves to further secure the semiconductor chip 102 to the substrate 101. In one embodiment, the conductor 104 may be made of a lead-free solder, a eutectic solder, or the like.

The semiconductor chip 102 is a structure comprising semiconductor materials. The semiconductor materials include bulk silicon, a semiconductor wafer, a silicon-on-insulator (SOI) substrate, or a silicon germanium substrate. Other semiconductor materials including group III, group IV, and group V elements may also be used. The semiconductor chip 102 may further comprise a plurality of isolation features (not shown), such as shallow trench isolation (STI) features or local oxidation of silicon (LOCOS) features. The isolation features may define and isolate various microelectronic elements (not shown). The microelectronic elements may include transistors (e.g., MOSFET), complementary metal oxide semiconductor (CMOS) transistors, bipolar junction transistors (BJT), high voltage transistors, high frequency transistors, p-channel and/or n-channel field effect transistors (PFETs/NFETs), diodes, resistors, capacitors, inductors, or other suitable elements. Fabrication processes for these microelectronic elements comprise deposition, etching, implantation, photolithography, annealing, or other suitable processes. These microelectronic elements are interconnected to form logic devices, memory devices (e.g., static random access memory or SRAM), radio frequency (RF) devices, input/output (I/O) devices, system-on-chip (SoC) devices, eFlash device, microelectromechanical (MEMS) devices, analog devices, CMOS devises, combinations of these, or the like.

The semiconductor chip 102 may be a laminated structure comprising a plurality of conductive layers and a plurality of dielectric layers. In one embodiment, the semiconductor chip 102 may comprise a plurality of extreme low-k dielectric (ELK) layers 1024 (see FIG. 1). The ELK layers 1024 have a dielectric constant less than about 2.5 (given that the dielectric constant of $SiO_2$ being about 4). ELK layers 1024 are used to provide good electrical isolation and prevent cross-talk between adjacent conductive layers of the semiconductor chip 102 and to reduce device power consumption. Common ELK materials include porous low-k materials (materials having high porosity).

In one embodiment, the semiconductor chip 102 comprises a bond pad 1022 formed on the active surface 106. The bond pad 1022 is utilized to electrically coupling external electrical contacts to one of the I/Os of the microelectronic elements of the semiconductor chip 102. The bond pad 1022 may comprise aluminum, copper or alloys thereof. A passivation layer 1023 is formed over the active surface 106 and on top of the bond pad 1022 for structural support and physical isolation. The passivation layer 1023 can protect the semiconductor chip 102 from mechanical damage (particle/scratch/contamination etc.) and other chemical corrosion. The passivation layer 1023 may be made with silicon nitride (SiN), silicon dioxide (SiO2), silicon oxynitride (SiON), polyimide (PI), benzocyclobutene (BCB), polybenzoxazole (PBO), or other insulating material. The passivation layer 1023 is patterned to include an opening so as to expose the bond pad 1022. The size, shape, and location of the opening as shown in FIG. 1 are only for illustration purposes and are not limiting.

In one embodiment, an under bump metallurgy (UBM) structure 1021 is formed (usually though sputtering, evaporation, plating and so on) over the exposed portion of the bond pad 1022 for connection of the conductive bump 103 to the bond pad 1022. The UBM structure 1021 may comprise a metallic adhesion layer forming on the bond pad 1022, a barrier layer for preventing diffusion, and a solder wettable layer for connecting the conductive bump 103. The UBM structure 1021 provides functions such as bump connection, diffusion barrier, proper adhesion and so on between the conductive bump 103 and the bond pad 1022.

Referring back to FIG. 1, the conductive bump 103 serves to provide physical and electrical connection between the semiconductor chip 102 (the UBM structure 1021) and the substrate 101 (the contact pad 1012). The conductive bump 103 may be of pillar shape (e.g., a necking pillar) and the material of the conductive bump 103 is selected from copper, gold, silver, zinc, bismuth, magnesium, antimony, indium and an alloy thereof. Using copper as the material for the conductive bump 103 has the following advantages: using copper pillars as the bonding elements not only helps achieve finer pitch with minimum probability of bump bridging but also reduces the capacitance load for the circuits (electronic interconnections). Copper pillars offer higher reliability, improved electrical and thermal performance. While conventional solder bumps collapse during solder reflow, copper pillars retain their shape.

In one embodiment, a metal cap layer 105 is formed between the conductor 104 and the conductive bump 103. The metal cap layer 105 could act as a barrier layer to prevent metal in the conductive bump 103 from diffusing into the conductor 104 (bonding material, such as solder alloy) that is used to bond the substrate 101 to the conductive bump 103, or to prevent metal in the conductor 104 from diffusing into the conductive bump 103. The prevention of metal diffusion increases the reliability and bonding strength of the semiconductor package. The metal cap layer 105 may include nickel (Ni), tin, tin-lead (SnPb), gold (Au), silver, palladium (Pd), indium (In), nickel-palladium-gold (NiP-dAu), nickel-gold (NiAu), other similar materials, or alloys deposited by plating methods. In some embodiments, the metal cap layer 105 may have a thickness about 1-10 μm. In some embodiments, the metal cap layer 105 is a multi-layer structure. In some embodiments, the metal cap layer 105 is a Ni film or a Ni alloy film formed by an electroplating process, electroless plating process or immersion plating process.

The substrate 101 may include multi-layered substrates, gradient substrates, hybrid orientation substrates, any combinations thereof and/or the like, such that the semiconductor package can accommodate more active and passive components and circuits. Conductive elements 1011 (e.g., conductive plugs, conductive vias, conductive posts, filler materials or conductive traces) are provided to form conductive path in the vertical directions. In one embodiment, solder mask 1012 is positioned on the bottom surface of the substrate 101, surrounding a ball land 1013, which are configured to receive an external terminal, such as a solder ball 1014, for making the external connectors of the semiconductor structure. In one embodiment, the substrate 101 comprises a PCB (Printed Circuit Board).

In one embodiment, the substrate 101 may comprise a dielectric core structure (layer) 1015 and buildup structures (laminates) 1016 disposed on two sides of the core structure 1015. Interconnecting the two buildup structures 1016 through the core structure 1015 is accomplished through plated through holes 1017. The plated through holes 1017 may be formed using either a drill or a laser to cut a holes through the core structure 1015. The plated through holes 1017 may be plated with a conductor such as copper and its alloys, or with other conductive metals and their alloys and may be filled with conductive plugs or filler material. The buildup structures 1016 may comprise a plurality of conducting layers and a plurality of insulating layers. The buildup structures 1016 may comprise conductive elements 1011 (e.g., conductive plugs, or filler materials) for interconnection to the conductive bump 103 or the solder ball 1014. In one embodiment, the substrate 101 may comprise a plurality of buildup structures 1016 without a core structure (i.e. the substrate 101 is formed as a coreless substrate). Since the coreless substrate 101 does not have any plating through hole, the wiring density of the coreless package substrate is increased. In addition, the absence of a core structure makes it easy to reduce overall thickness of the substrate 101. In one embodiment, the material(s) for the substrate 101 may be selected that the elastic modulus of the substrate 101 is kept relatively low, which allows for more flexibility in the overall connection between the substrate 101 and the semiconductor chip 102 and accordingly helps avoid warpage of the substrate 101. In one embodiment, the material(s) for the substrate 101 can be selected from (but not limited to) epoxy resin, polymercaptan curing agent, or tertiary amine curing acceler.

It should be noted that conventional flip chip package arrangement has a problem that it is subject to different temperatures during the packaging process. For instance, different temperatures arise with the cool down from the solder joining temperature and the underfill curing temperature. The result is that the package is highly stressed due to the different coefficients of thermal expansion (CTE) of the various package substrate and chip materials. Accordingly, the high stress experienced by the substrate 101 in high temperature or during cooling may cause the substrate 101 to bow, warp or crack. This problem is worsened in the case of a relatively large chip. In addition, the stress may also result in crack/delamination in the dielectric layers of the semiconductor chip (especially for semiconductor chips/wafers with ELK layers since common materials for ELK layers usually have high porosity). To solve the problem, the conductive bump 103 of the present disclosure is configured as a necking pillar having non-uniform cross-sectional area and reduced volume (as compared with the volume of a conductive pillar bump having uniform cross-sectional area) such that it can absorb the structures' internal stresses so as to prevent crack/delamination in the dielectric layers of the semiconductor chips and to enhance the reliability.

Figure 2:
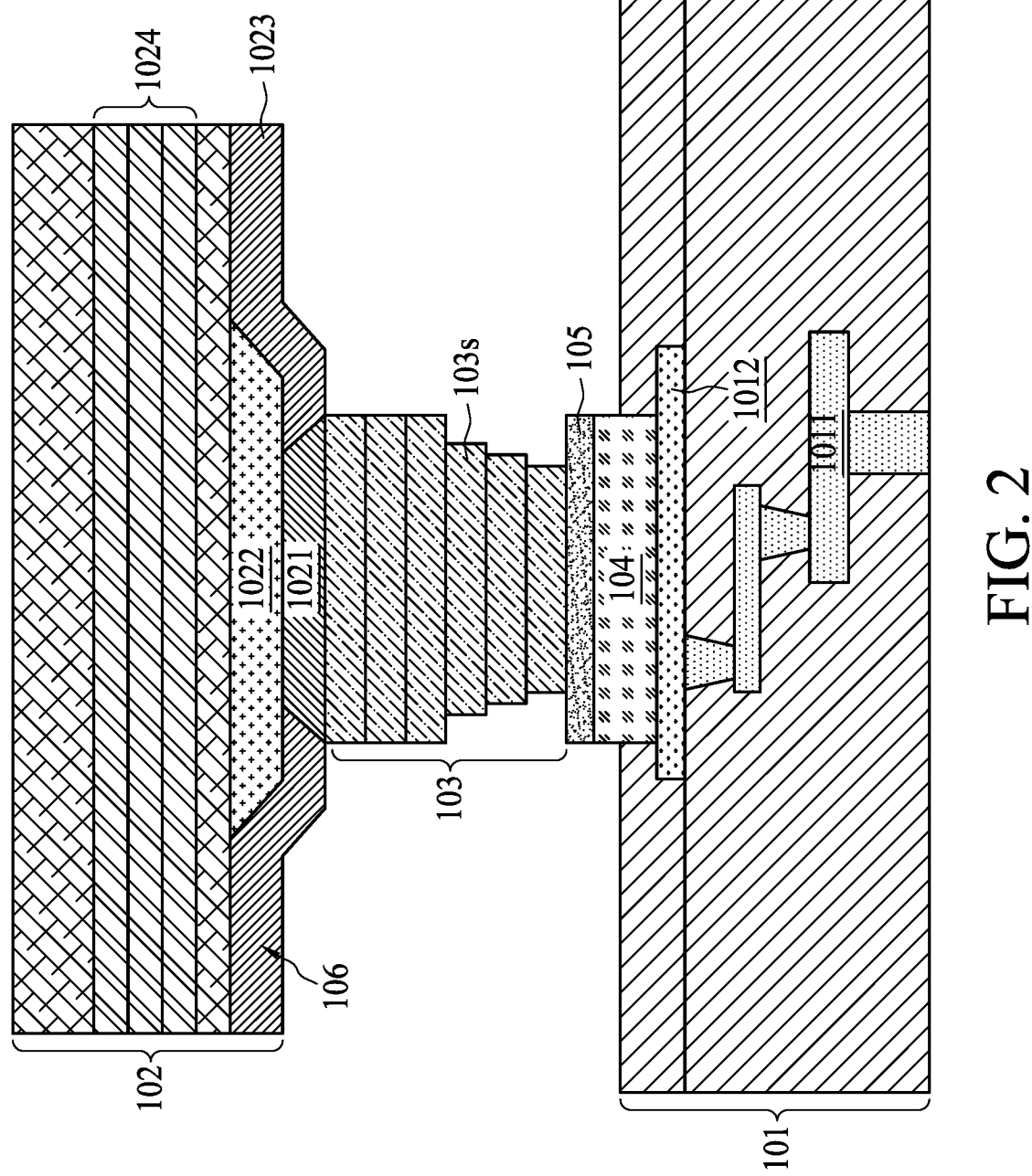
FIG. 2 is a partial enlargement of the semiconductor structure of FIG. 1.
Figure 3:
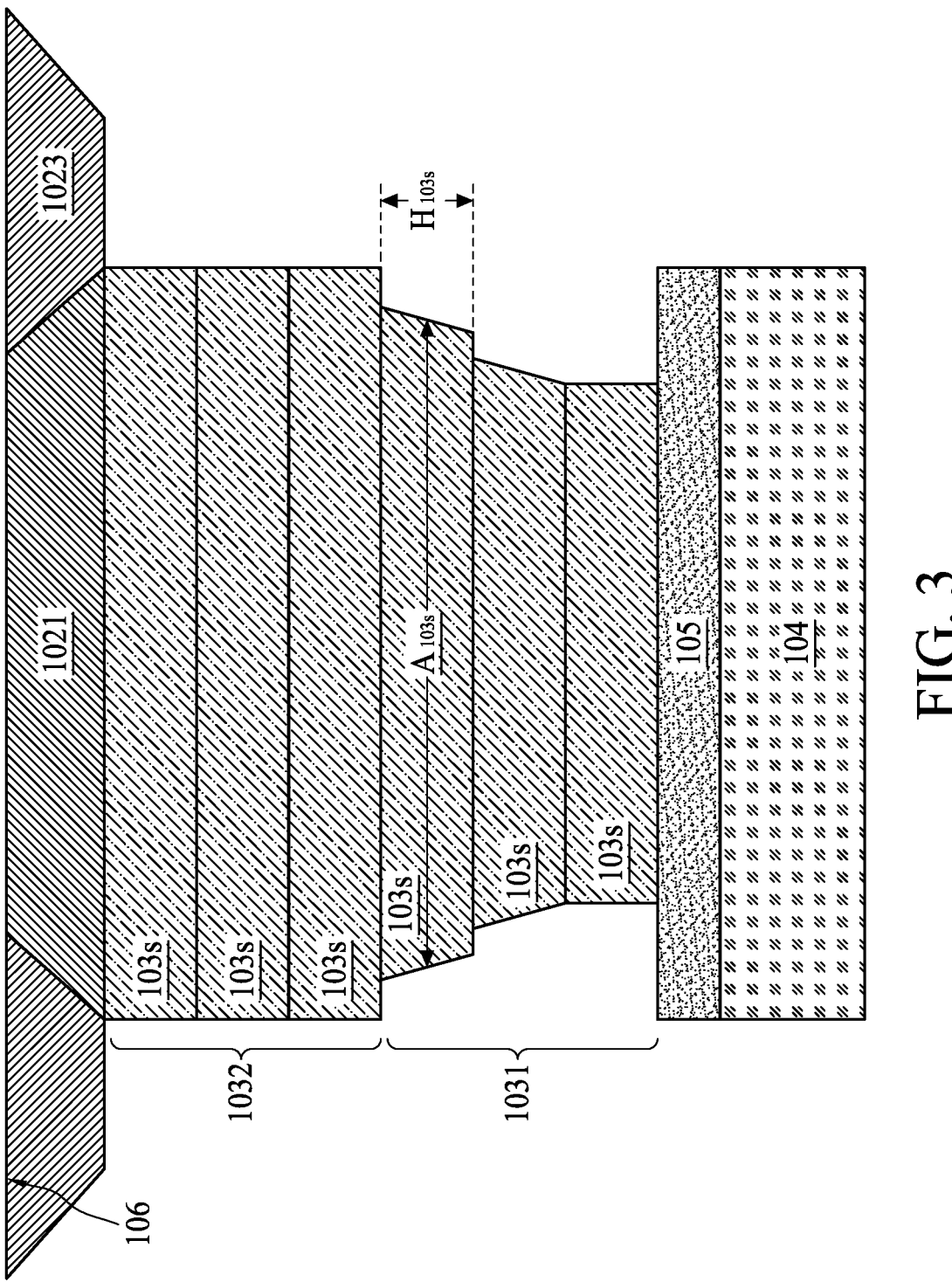
FIG. 3 is a cross-sectional view illustrating a conductive bump in accordance with one embodiment of the present disclosure.

The detailed configuration of various embodiments of the conductive bump 103 is further depicted in FIGS. 2-7. As shown in FIG. 2 (which is a partial enlargement of the semiconductor structure 100 of FIG. 1), the conductive bump 103 comprises a plurality of bump segments 103s, wherein each bump segment 103s may comprise the shape of a flattened pillar (disk) or a flattened frustum. Generally, the height of the conductive bump 103 may be about 20 μm to about 50 μm and the diameter of the conductive bump 103 may be about 30 μm to about 90 μm. FIG. 3 is a cross-sectional view illustrating a conductive bump 103 in accordance with one embodiment of the present disclosure. According to FIG. 3, the plurality of bump segments 103s include a first group of bump segments 1031 and a second group of bump segments 1032. For instance, the conductive bump 103 as shown in the embodiment of FIG. 3 comprises 6 bump segments, wherein the first segment group 1031 has 3 bump segments 103s and the second segment group 1032 also has 3 bump segments 103s. Regarding the plurality of bump segments 103s, each bump segment 103s comprises the same segment height $H_{103s}$ in a direction orthogonal to the active surface 106 of the semiconductor chip 102. Since the conductive bump 103 has non-uniform cross-sectional area, the cross-sectional area within each bump segment 103s varies. For convenience the average cross-sectional area $A_{103s}$ of each bump segment 103s serves to represent the dimension of the bump segment 103s in the plane parallel to the active surface 106. According to the present disclosure, the average cross-sectional area $A_{103s}$ of each bump segment of the first segment group 1031 is smaller than the average cross-sectional area $A_{103s}$ of any bump segment of the second segment group 1032. In addition, each bump segment 103s comprises a volume defined by the multiplication of the segment height $H_{103s}$ with the average cross-sectional area $A_{103s}$ associated with the bump segment 103s.

As previously mentioned, the conductive bump 103 of the present disclosure has non-uniform cross-sectional area and reduced volume as compared with the volume of a conductive pillar bump having uniform cross-sectional area. According to the present disclosure, the conductive bump 103 is such configured that the total volume of the first segment group 1031 is less than that of the second segment group 1032. According to the present disclosure, the total volume ratio between the first and second segment groups 1031 and 1032 (the ratio of the total volume of the first segment group 1031 to the total volume of the second segment group 1032) is between about 0.03 and about 0.8. In one embodiment, the total volume ratio between the two groups is between about 0.03 and about 0.1. In one embodiment, the total volume ratio between the two groups is between about 0.1 and about 0.5. In one embodiment, the total volume ratio between the two groups is between about 0.5 and about 0.8.

Figure 4:
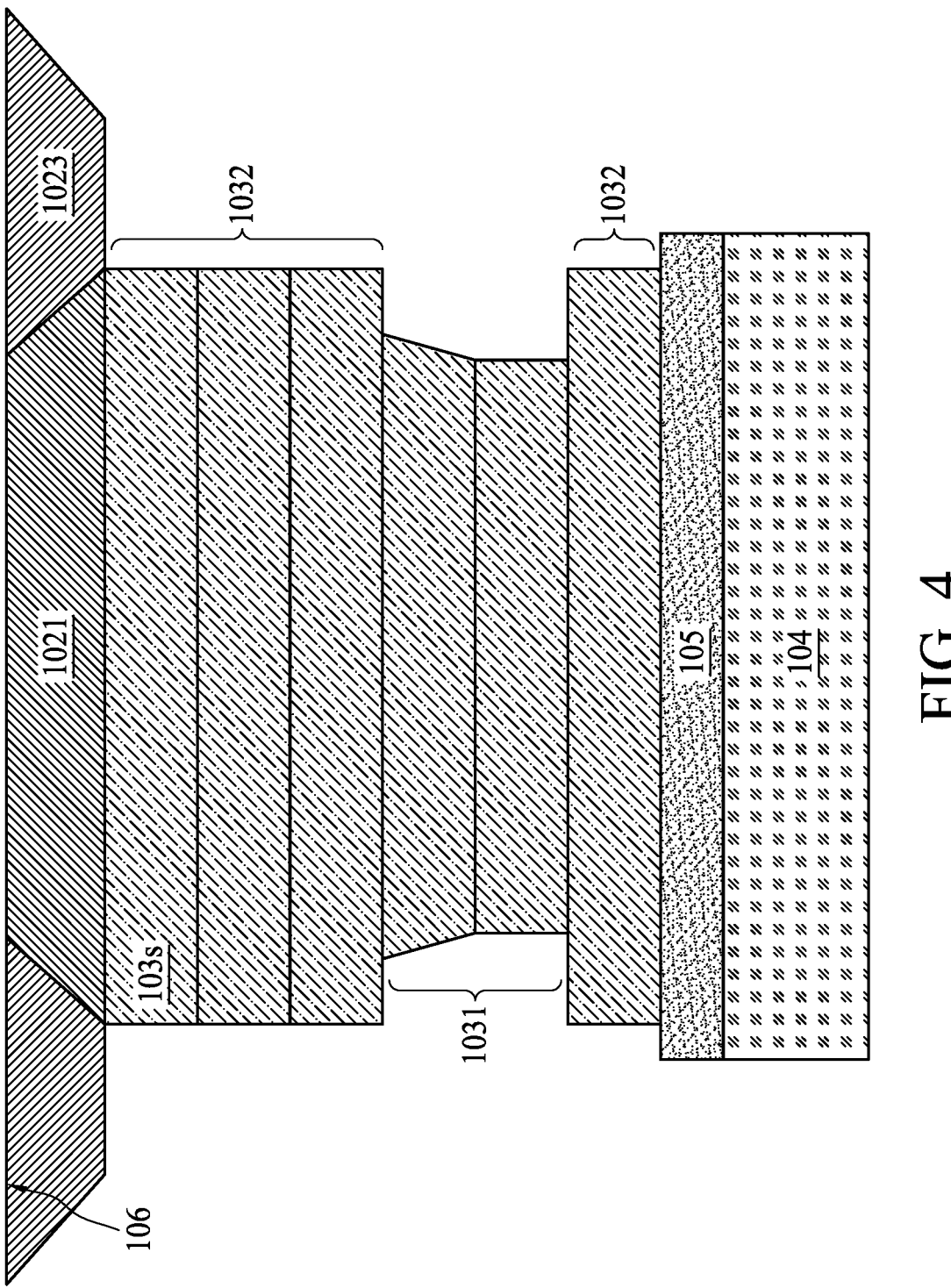
FIG. 4 is a cross-sectional view illustrating a conductive bump in accordance with one embodiment of the present disclosure.
Figure 5:
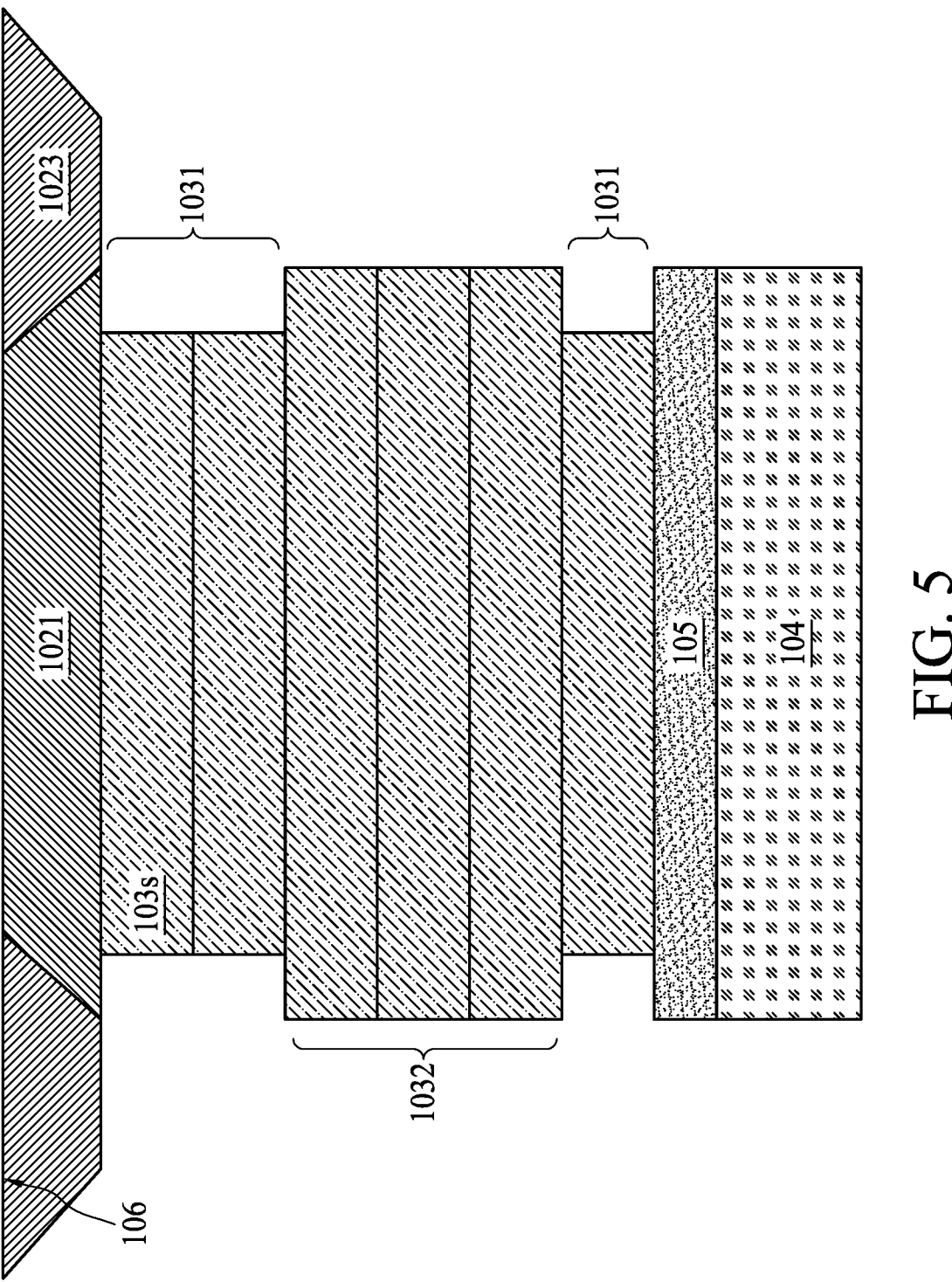
FIG. 5 is a cross-sectional view illustrating a conductive bump in accordance with one embodiment of the present disclosure.
Figure 6:
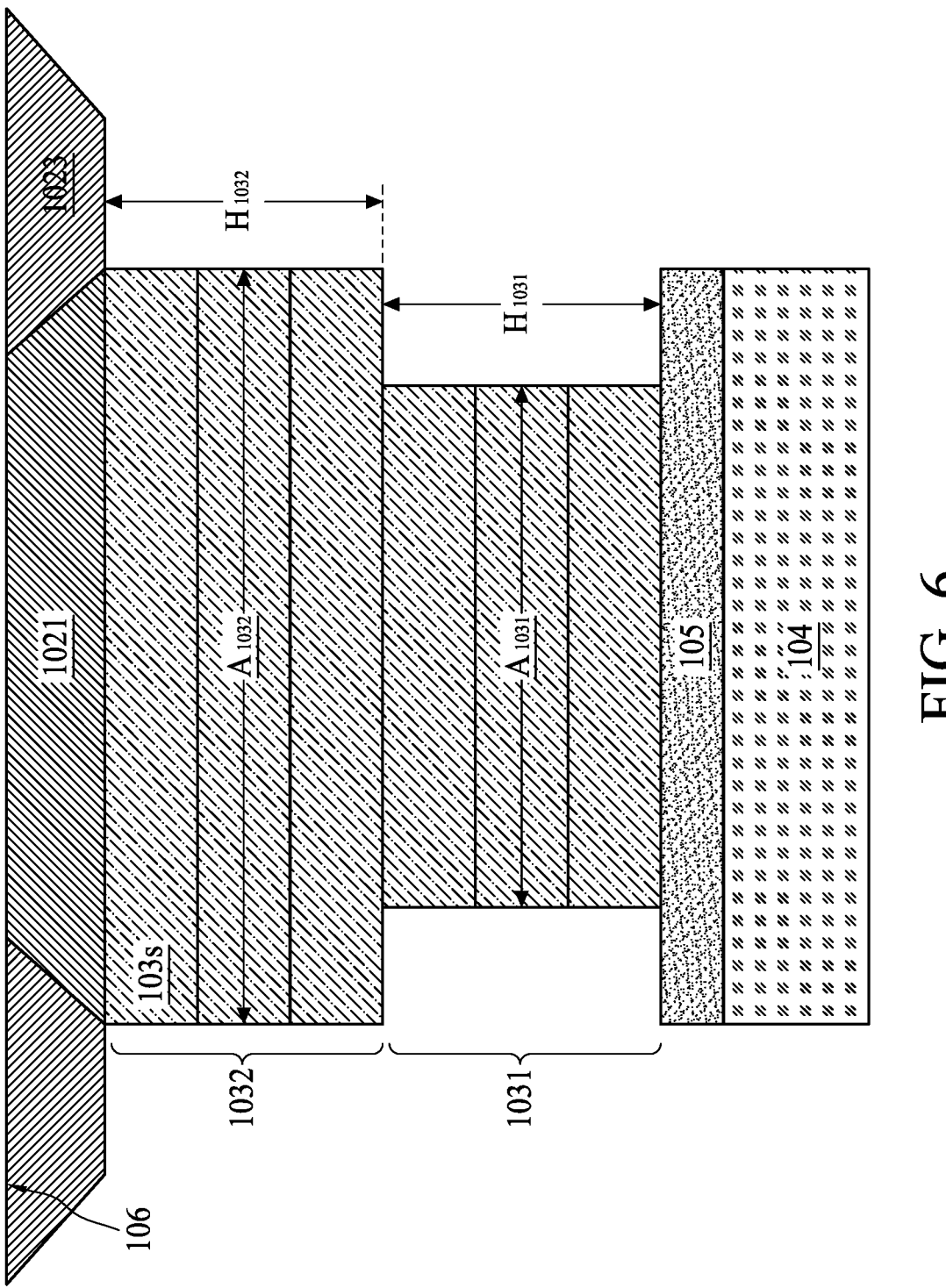
FIG. 6 is a cross-sectional view illustrating a conductive bump in accordance with one embodiment of the present disclosure.
Figures 7A, 7B, 7C, 7D, 7E, 7F, 7G, 7H:
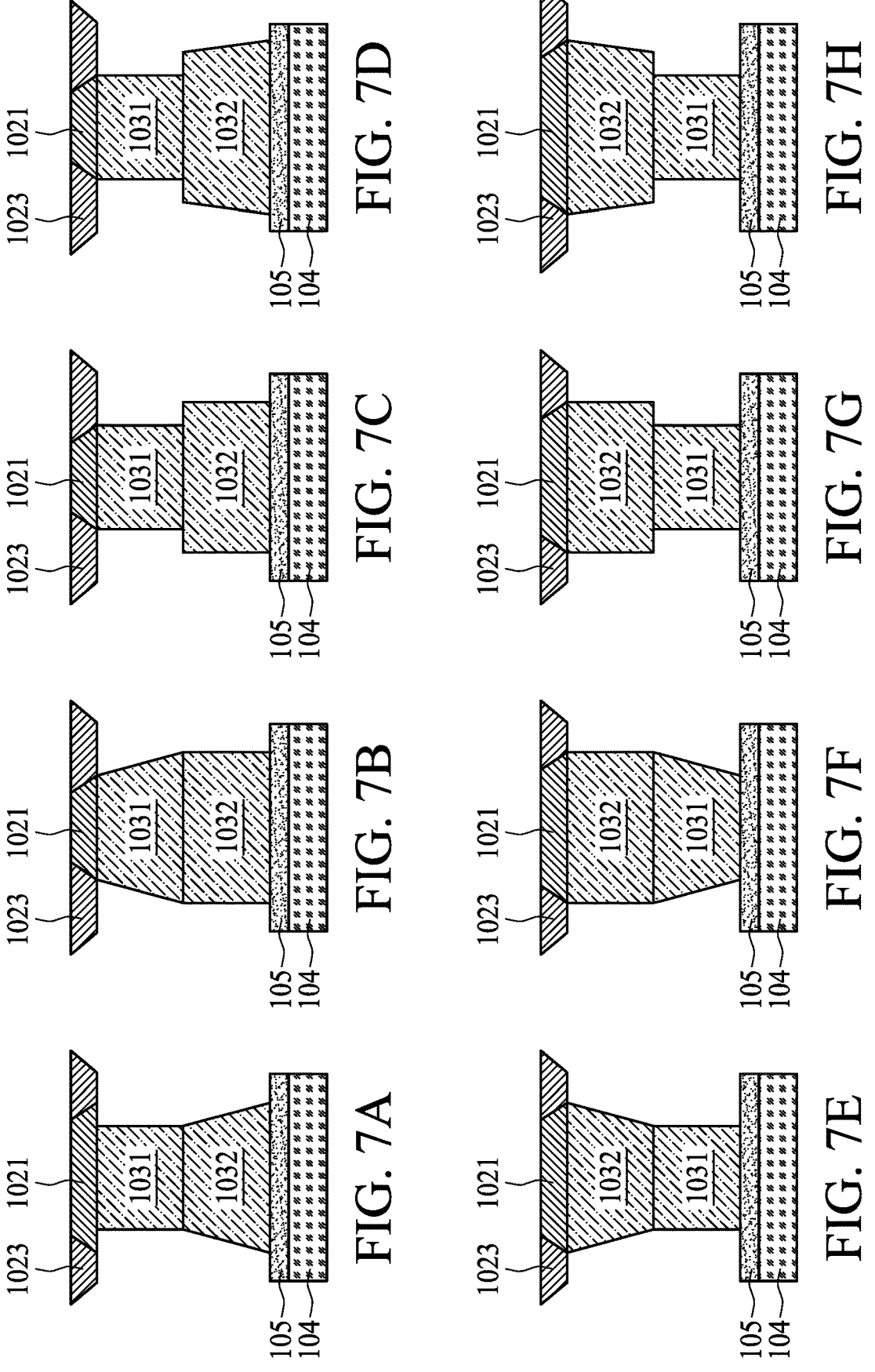
FIGS. 7A-7H show cross-sectional views illustrating conductive bumps in accordance with some embodiments of the present disclosure.

FIGS. 4-6 show cross-sectional views illustrating conductive bumps 103 in accordance with other embodiments of the present disclosure. In FIG. 4, the first segment group 1031 is sandwiched between the bump segments of the second segment group 1032, while in FIG. 5 the second segment group 1032 is sandwiched between the bump segments of the first segment group 1031.

In FIG. 6, the first segment group 1031 comprises a group of adjacent/neighboring bump segments and the second segment group 1032 also comprises a group of adjacent/neighboring bump segments. All the bump segments of the first segment group 1031 may have the same average cross-sectional area and all the bump segments of the second segment group 1032 may also have the same average cross-sectional area. For the first and second segment groups having adjacent/neighboring bump segments, the total segment height of the first segment group 1031 is denoted as $H_{1031}$ and the total segment height of the second segment group 1032 is denoted as $H_{1032}$. In one embodiment, the ratio of $H_{1031}$ to $H_{1032}$ is between about 0.3 and about 1, namely the ratio of $H_{1031}$ to "$H_{1031}$ plus $H_{1032}$" is between about 0.25 and about 0.5. In one embodiment, the ratio of $H_{1031}$ to $H_{1032}$ is between about 0.3 and about 0.7. In one embodiment, the ratio of $H_{1031}{}^{to}$ $H_{1032}$ is between about 0.7 and about 1.

Referring again to FIG. 6, the average cross-sectional area of the first segment group 1031 is denoted as $A_{1031}$ and the average cross-sectional area of the second segment group 1032 is denoted as $A_{1032}$. In one embodiment, the ratio of $A_{1031}$ to $A_{1032}$ is between about 0.06 and about 0.65. In one embodiment, the ratio of $A_{1031}$ to $A_{1032}$ is between about 0.06 and about 0.1. In one embodiment, the ratio of $A_{1031}$ to $A_{1032}$ is between about 0.1 and about 0.3. In one embodiment, the ratio of $A_{1031}$ to $A_{1032}$ is between about 0.3 and about 0.65.

FIGS. 7A-7H show cross-sectional views illustrating conductive bumps in accordance with some embodiments of FIG. 6. In FIGS. 7A-7H, the bump segments of the first segment group 1031 are collectively formed to have the shape of a pillar or a frustum, and the bump segments of the second segment group 1032 are also collectively formed to have the shape of a pillar or a frustum.

Figure 8:
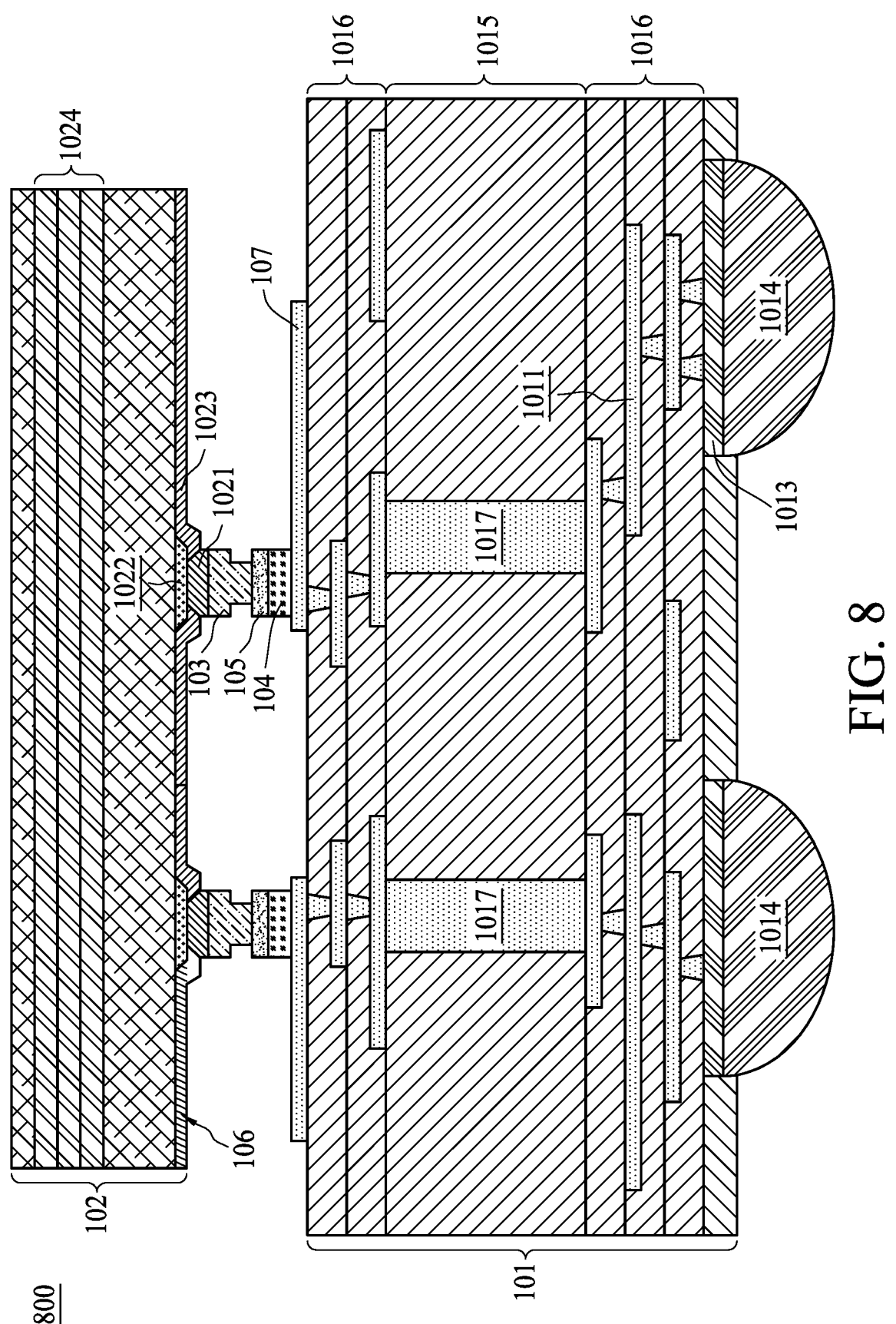
FIG. 8 is a cross-sectional view illustrating a semiconductor structure in accordance with one embodiment of the present disclosure.

FIG. 8 is a cross-sectional view illustrating the semiconductor structure 800 in accordance with one embodiment of the present disclosure. The semiconductor structure 800 includes a substrate 101 and a semiconductor chip 102. Patterned conductive traces 107 are provided on a surface of the substrate 101 (which surface faces an active surface 106 of the semiconductor chip 102). A conductive bump 103 lands on and is coupled to a conductive trace 107. The conductive bump 103 may be coupled to the conductive trace 107 with a conductor 104. The semiconductor chip 102 and the substrate 101 are electrically connected and coupled together by the conductive bump 103.

Figure 9:
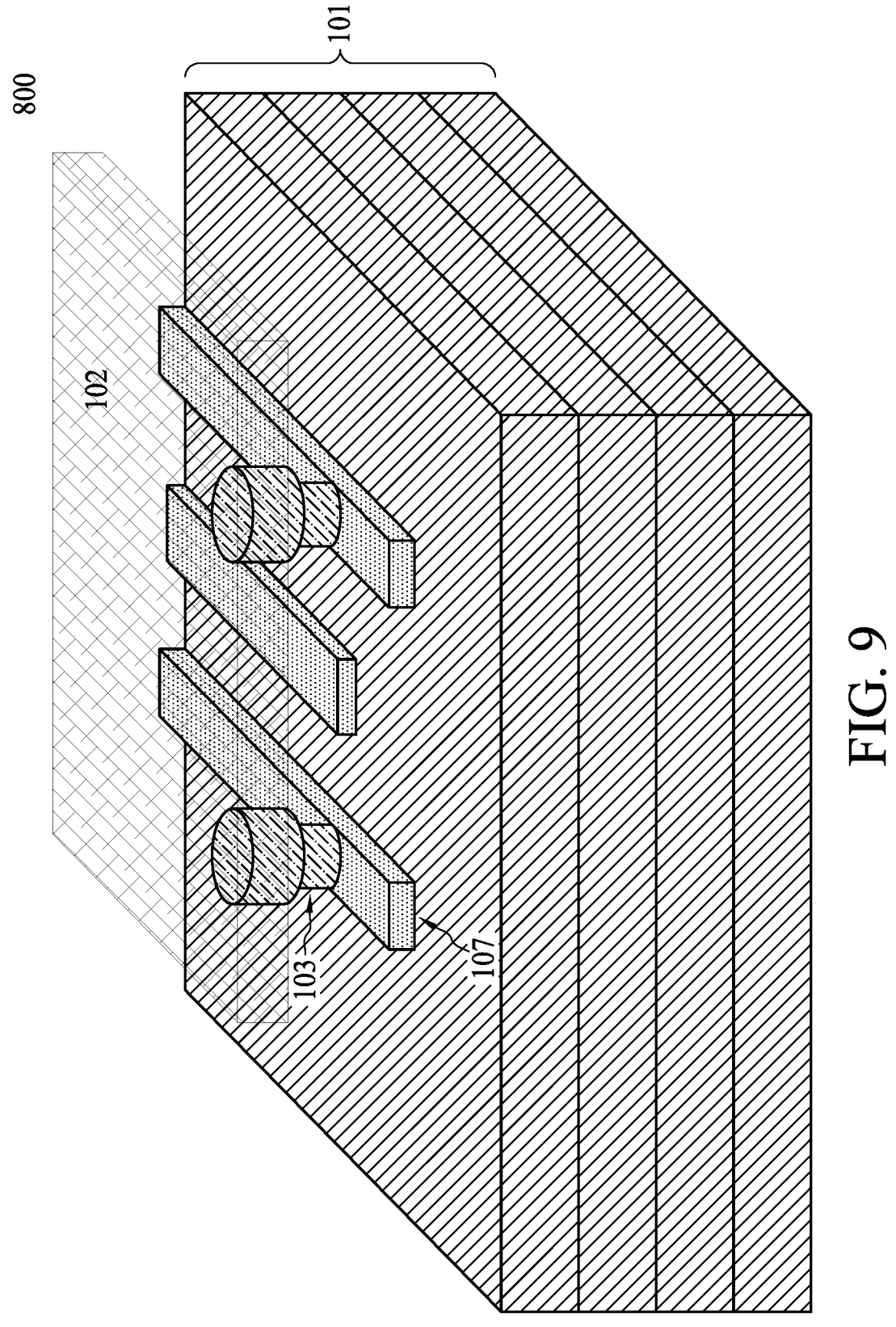
FIG. 9 is a top view of the semiconductor structure of FIG. 8.

FIG. 9 shows a top view of the semiconductor structure 800 of FIG. 8. According to the above Bump-on-Trace (BOT) structures, the conductive bump 103 directly lands on the conductive trace 107 of the substrate 101. The advantages of BOT structures include smaller chip area requirement and low manufacturing cost. The conductive traces 104 may be formed of substantially pure copper, aluminum copper, or other metallic materials such as tungsten, nickel, palladium, gold, and/or alloys thereof.

Referring back to FIG. 8, the conductive bump 103 may have the same configuration as shown in FIGS. 2-7. In the following passages, the conductive bump 103 of FIG. 8 should be discussed with reference to FIGS. 2-7. In one embodiment, the conductive bump 103 of FIG. 8 comprises a plurality of bump segments 103s. The plurality of bump segments 103s include a first group of bump segments 1031 and a second group of bump segments 1032, wherein each bump segment 103s comprises the same segment height in a direction orthogonal to the active surface 106 of the semiconductor chip 102. Each bump segment 103s has its average cross-sectional area, wherein the average cross-sectional area of each of the first segment group 1031 is smaller than the average cross-sectional area of each of the second segment group 1032. In addition, each bump segment 103s comprises a volume defined by the multiplication of the segment height with the average cross-sectional area associated with the bump segment 103s. According to the present disclosure, the total volume ratio between the first and second segment groups 1031 and 1032 is between about 0.03 and about 0.8. In one embodiment, the ratio of the total segment height of the first segment group 1031 to that of the second segment group 1032 is between about 0.3 and about 1. In one embodiment, the ratio of the average cross-sectional area of the first segment group 1031 to that of the second segment group 1032 is between about 0.06 and about 0.65.

Figure 10:
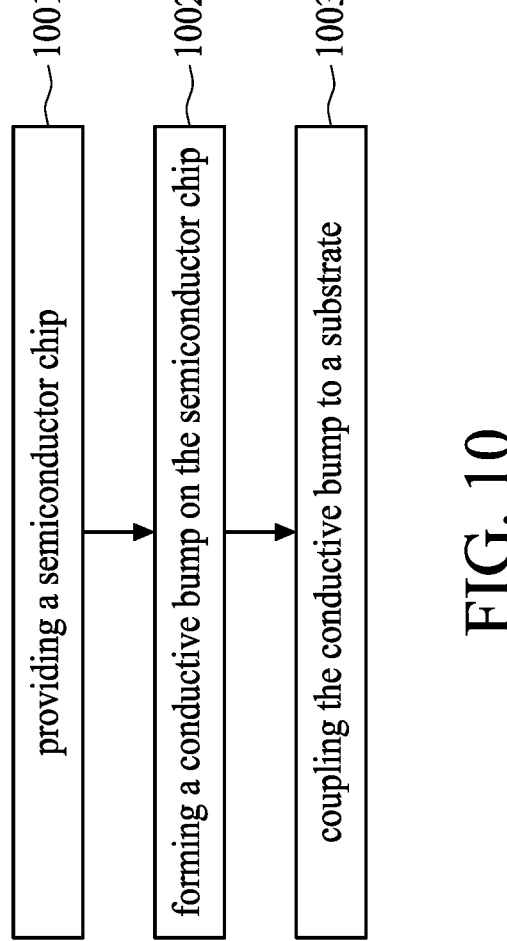
FIG. 10 shows a flow chart of manufacturing a semiconductor structure in accordance with one embodiment of the present disclosure.

FIG. 10 is a flowchart of a method of manufacturing a semiconductor structure in accordance with one embodiment of the present disclosure. In operation 1001, a semiconductor chip 102 having an active surface 106 is provided. In operation 1002, a conductive bump 103 is formed over the active surface 106 of the semiconductor chip 102. In operation 1003, the conductive bump 103 is coupling to a substrate 101. The conductive bump 103 may have the same configuration as shown in FIGS. 2-7. In one embodiment, the conductive bump 103 comprises a plurality of bump segments 103s. The plurality of bump segments 103s include a first group of bump segments 1031 and a second group of bump segments 1032, wherein each bump segment 103s comprises the same segment height in a direction orthogonal to the active surface 106 of the semiconductor chip 102. Each bump segment 103s has its average cross-sectional area, wherein the average cross-sectional area of each of the first segment group 1031 is smaller than the average cross-sectional area of each of the second segment group 1032. In addition, each bump segment 103s comprises a volume defined by the multiplication of the segment height with the average cross-sectional area associated with the bump segment 103s. According to the present disclosure, the total volume ratio between the first and second segment groups 1031 and 1032 is between about 0.03 and about 0.8. In one embodiment, the ratio of the total segment height of the first segment group 1031 to that of the second segment group 1032 is between about 0.3 and about 1. In one embodiment, the ratio of the average cross-sectional area of the first segment group 1031 to that of the second segment group 1032 is between about 0.06 and about 0.65.

Figures 11J, 11K:
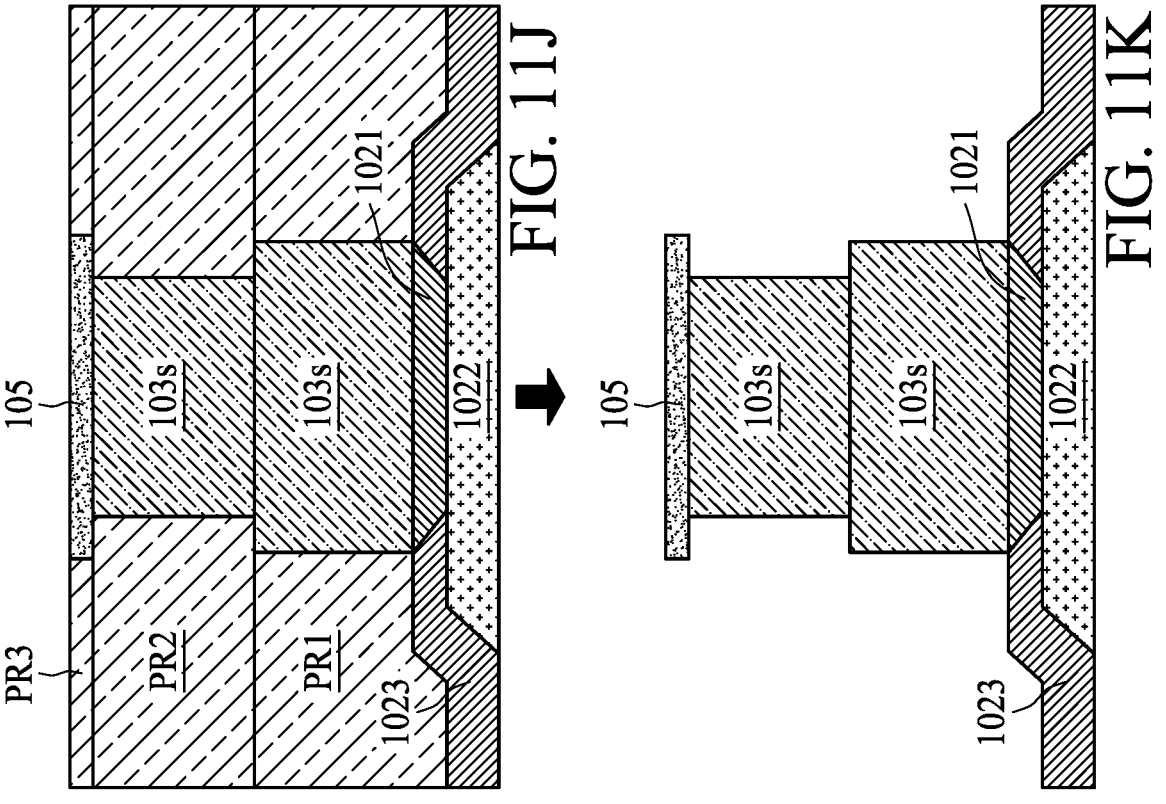

FIGS. 11A-11K schematically illustrate a method of forming a conductive bump over a semiconductor chip in accordance with one embodiment of the present disclosure. In FIG. 11A, a semiconductor chip 102 having a bond pad 1022 formed on a surface thereof is provided, wherein a passivation layer 1023 is formed on the semiconductor chip 102 and the bond pad 1022 and an under bump metallurgy (UBM) structure 1021 is disposed on the exposed portion of the bond pad 1022. In FIG. 11B, a first photoresist layer PR1 is coated on the passivation layer 1023 and the UBM structure 1021. In FIG. 11C, the first photoresist layer PR1 is patterned to expose the UBM structure 1021. In one embodiment, a photomask (not shown) having a predefined pattern (or an opening) is provided over the first photoresist layer PR1 and a UV light is illuminated on the first photoresist layer PR1 through the photomask. After illumination, the first photoresist layer PR1 is patterned to form a first opening 1101 exposing the UBM structure 1021, wherein the first opening 1101 has the shape of a pillar or a frustum. In FIG. 11D, a first bump segment 103*s* is formed within the first opening 1101 by sputtering or plating. In FIG. 11E, a second photoresist layer PR2 is coated on the first photoresist layer PR1 and the first bump segment 103*s*. In FIG. 11F, the second photoresist layer PR2 is patterned to expose first bump segment 103*s*, wherein the second photoresist layer PR2 is patterned to form a second opening 1102 having the shape of a pillar or a frustum. In FIG. 11G, a second bump segment 103*s* is formed within the first opening 1101 by sputtering or plating. It should be noted that the average cross-sectional area and the segment height of the first bump segment 103*s* are different to those of the second bump segment 103*s*. In FIG. 11H, a third photoresist layer PR3 is coated on the second photoresist layer PR2 and the second bump segment 103*s*. In FIG. 11I, the third photoresist layer PR3 is patterned to expose second bump segment 103*s*, wherein the third photoresist layer PR3 is patterned to form a third opening 1103. In FIG. 11J, a metal cap layer 105 is formed within the third opening 1103 by sputtering or plating. In FIG. 11K, the photoresist layers PR1, PR2 and PR3 are stripped off to form the conductive bump comprising the first and second bump segments 103*s*.

FIGS. 12A-12G schematically illustrate a method for forming an under bump metallurgy (UBM) structure in accordance with one embodiment of the present disclosure. In FIG. 12A, a semiconductor chip 102 having a bond pad 1022 on a surface thereof is provided. In FIG. 12B, a passivation layer 1023 is formed on the semiconductor chip 102 and the bond pad 1022. In FIG. 12C, the passivation layer 1023 is patterned to form an opening exposing the bond pad 1022. In FIG. 12D, an adhesion layer 1021*a* is formed over the passivation layer 1023 and the exposed bond pad 1022 by sputtering or plating. In FIG. 12E, a barrier layer 1021*b* is formed over the adhesion layer 1021*a* by sputtering or plating. In FIG. 12F, a wetting layer 1021*c* is formed over the barrier layer 1021*b* by sputtering or plating. In FIG. 12G, the adhesion layer 1021*a*, the barrier layer 1021*b* and the wetting layer 1021*c* are patterned to form the UBM structure 1021 over the exposed bond pad 1022 (removal of the unwanted portion of the three layers). Patterning the adhesion layer 1021*a*, the barrier layer 1021*b* and the wetting layer 1021*c* may comprise: forming a photoresist layer over the wetting layer 1021*c*; patterning the photoresist layer to expose a portion of the wetting layer 1021*c*; removing (e.g., etching off) the exposed portion of the wetting layer 1021*c* and also removing the portion of the barrier layer 1021*b* and the adhesion layer 1021*a* located underneath the exposed portion of the wetting layer 1021*c*; and stripping off the photoresist layer (using acetone, n-methyl pyrrolidone (NMP), dimethyl sulfoxide (DMSO), aminoethoxy ethanol, and the like). In one embodiment, the etching of the unwanted portion of the UBM layers comprises wet etching and dry etching. For the wet etching process, unwanted portion of the UBM layers is dissolved when immersed in a bath of liquid-phase ("wet") etchants, which must be agitated to achieve good process control, wherein wet etchants are usually isotropic. For the dry etching process, unwanted portion of the UBM layers is bombarded by ions (usually a plasma of reactive gases such as fluorocarbons, oxygen, chlorine, boron trichloride; sometimes with addition of nitrogen, argon, helium and other gases). Unlike with many of the wet chemical etchants used in wet etching, the dry etching process typically etches directionally or anisotropically. The dry etching process comprises ion milling (sputter etching), reactive-ion etching (RIE), deep reactive-ion etching (DRIE) and so on.

Some embodiments of the present disclosure provide a semiconductor structure, comprising: a semiconductor chip; a substrate facing an active surface of the semiconductor chip; and a conductive bump extending from the active surface of the semiconductor chip toward the substrate, wherein the conductive bump comprises: a plurality of bump segments comprising a first group of bump segments and a second group of bump segments, wherein each bump segment comprises the same segment height in a direction orthogonal to the active surface of the semiconductor chip, and each bump segment comprises a volume defined by the multiplication of the segment height with the average cross-sectional area of the bump segment; wherein the ratio of the total volume of the first group of bump segments to the total volume of the second group of bump segments is between about 0.03 and about 0.8.

Some embodiments of the present disclosure provide a semiconductor structure, comprising: a semiconductor chip; a substrate facing an active surface of the semiconductor chip, wherein the substrate comprises a conductive trace formed on a surface thereof; a conductive bump extending from the active surface of the semiconductor chip toward the substrate; a metal cap layer on the conductive bump; a conductor coupling the metal cap layer to the conductive trace, wherein the conductive bump comprises: a plurality of bump segments comprising a first group of bump segments and a second group of bump segments, wherein each bump segment comprises the same segment height in a direction orthogonal to the active surface of the semiconductor chip, and each bump segment comprises a volume defined by the multiplication of the segment height with the average cross-sectional area of the bump segment; wherein the ratio of the total volume of the first group of bump segments to the total volume of the second group of bump segments is between about 0.03 and about 0.8.

Some embodiments of the present disclosure provide a method for fabricating a semiconductor structure comprising: providing a semiconductor chip comprising an active surface; forming a conductive bump over the active surface of the semiconductor chip; and coupling the conductive bump to a substrate, wherein the conductive bump comprises: a plurality of bump segments comprising a first group of bump segments and a second group of bump segments, wherein each bump segment comprises the same segment height in a direction orthogonal to the active surface of the semiconductor chip, and each bump segment comprises a volume defined by the multiplication of the segment height with the average cross-sectional area of the bump segment; wherein the ratio of the total volume of the first group of bump segments to the total volume of the second group of bump segments is between about 0.03 and about 0.8.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application is not intended to be limited to the particular embodiments of the process, machine, manufacture, and composition of matter, means, methods and operations described in the specification. As those skilled in the art will readily appreciate from the disclosure of the present disclosure, processes, machines, manufacture, composition of matter, means, methods or operations presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or operations. In addition, each claim constitutes a separate embodiment, and the combination of various claims and embodiments are within the scope of the disclosure.

What is claimed is:

1. A semiconductor structure, comprising:
a semiconductor chip;
a substrate facing an active surface of the semiconductor chip;
a plurality of bump segments, comprising a first group of bump segments and a second group of bump segments collectively extended from the active surface toward the substrate, wherein each bump segment of the first group of bump segments and the second group of bump segments has a same segment thickness in a direction orthogonal to the active surface of the semiconductor chip, and comprises two opposite side surfaces exposed to an environment outside the bump segments;
wherein each bump segment of the second group of bump segments has a cross-sectional area greater than a cross-sectional area of each bump segment of the first group of bump segments; the first group of bump segments comprises a first bump segment and a second bump segment; one of the opposite side surfaces of the first bump segment is a tapered side surface exposed to the environment, and one of the opposite side surfaces of second bump segment is a tapered side surface exposed to the environment; a portion of a bottom surface of the second bump segment is stacked on the first bump segment, and another portion of the bottom surface of the second bump segment is exposed to the environment, wherein in a side view, a bottom surface of the second bump segment is wider than an interfacial width where the second bump segment contacts a top surface of the first bump segment.

2. The semiconductor structure of claim 1, wherein a cross-sectional area of the second bump segment is greater than a cross-sectional area of the first bump segment.

3. The semiconductor structure of claim 1, wherein the first group of bump segments further comprises a third bump segment, and one of the opposite side surfaces of the third bump segment is orthogonal to the active surface; the first bump segment is disposed between the second bump segment and the third bump segment.

4. The semiconductor structure of claim 3, wherein a cross-sectional area of the third bump segment is less than a cross-sectional area of the first bump segment, and less than a cross-sectional area of the second bump segment.

5. The semiconductor structure of claim 1, wherein a ratio of a total segment thickness of the first group of bump segments to a total segment thickness of the second group of bump segments is between 0.3 and 1.

6. The semiconductor structure of claim 1, wherein a ratio of the average cross-sectional area of the first group of bump segments to an average cross-sectional area of the second group of bump segments is between 0.06 and 0.65.

7. The semiconductor structure of claim 1, wherein each bump segment comprises a shape of a pillar or a frustum.

8. The semiconductor structure of claim 1, further comprising a metal cap layer disposed between the substrate and the first group of bump segments.

9. A semiconductor structure, comprising:
a semiconductor chip;
a substrate facing an active surface of the semiconductor chip;
a plurality of bump segments, comprising a first group of bump segments and a second group of bump segments collectively extended from the active surface toward the substrate, wherein each bump segment of the first group of bump segments and the second group of bump segments has a same segment thickness in a direction orthogonal to the active surface of the semiconductor chip, and comprises two opposite side surfaces exposed to an environment outside the bump segments;
wherein each bump segment of the second group of bump segments has a cross-sectional area greater than a cross-sectional area of each bump segment of the first group of bump segments;
wherein the first group of bump segments comprises a first bump segment and a second bump segment; one of the opposite side surfaces of the first bump segment is a tapered side surface exposed to the environment, and one of the opposite side surfaces of the second bump segment is a tapered side surface exposed to the environment; wherein in a side view, a width of a bottom surface of the second bump segment is greater than a width of an interfacial surface where the second bump segment contacts a top surface of the first bump segment along a direction parallel to the active surface of the semiconductor chip.

10. The semiconductor structure of claim 9, wherein a cross-sectional area of the second bump segment is greater than a cross-sectional area of the first bump segment.

11. The semiconductor structure of claim 9, wherein the first group of bump segments further comprises a third bump segment, and one of the opposite side surfaces of the third bump segment is orthogonal to the active surface; the first bump segment is disposed between the second bump segment and the third bump segment.

12. The semiconductor structure of claim 11, wherein a cross-sectional area of the third bump segment is less than a cross-sectional area of the first bump segment, and less than a cross-sectional area of the second bump segment.

13. The semiconductor structure of claim 9, wherein a ratio of a total segment thickness of the first group of bump segments to a total segment thickness of the second group of bump segments is between 0.3 and 1.

14. The semiconductor structure of claim 9, wherein a ratio of the average cross-sectional area of the first group of bump segments to an average cross-sectional area of the second group of bump segments is between 0.06 and 0.65.

15. The semiconductor structure of claim 9, wherein each bump segment comprises a shape of a pillar or a frustum.

16. The semiconductor structure of claim 9, further comprising a metal cap layer disposed between the substrate and the first group of bump segments.

17. A semiconductor structure, comprising:

a semiconductor chip;

a substrate facing an active surface of the semiconductor chip;

a plurality of bump segments, comprising a first group of bump segments and a second group of bump segments collectively extended from the active surface toward the substrate, wherein each bump segment of the first group of bump segments and the second group of bump segments has a same segment thickness in a direction orthogonal to the active surface of the semiconductor chip, and comprises two opposite side surfaces exposed to an environment outside the bump segments;

wherein each bump segment of the second group of bump segments has a cross-sectional area greater than a cross-sectional area of each bump segment of the first group of bump segments; the first group of bump segments comprises a first bump segment, a second bump segment and a third bump segment; one of the opposite side surfaces of the first bump segment is a tapered side surface exposed to the environment, one of the opposite side surfaces of the second bump segment is a tapered side surface exposed to the environment, and one of the opposite side surfaces of the third bump segment is orthogonal to the active surface; the first bump segment is disposed between the second bump segment and the third bump segment, wherein a bottom surface of the second bump segment has a larger area with a greater width than an interface where it contacts a top surface of the first bump segment.

18. The semiconductor structure of claim 17, wherein a cross-sectional area of the second bump segment is greater than a cross-sectional area of the first bump segment.

19. The semiconductor structure of claim 18, wherein a cross-sectional area of the third bump segment is less than a cross-sectional area of the first bump segment.

20. The semiconductor structure of claim 17, further comprising a metal cap layer disposed between the substrate and the first group of bump segments.

* * * * *